(12) United States Patent
Roberts

(10) Patent No.: US 6,721,671 B2
(45) Date of Patent: Apr. 13, 2004

(54) DIRECTIONAL ELEMENT TO DETERMINE FAULTS ON UNGROUNDED POWER SYSTEMS

(75) Inventor: Jeffrey B. Roberts, Viola, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 74 days.

(21) Appl. No.: 09/999,837

(22) Filed: Oct. 24, 2001

(65) Prior Publication Data

US 2003/0078745 A1 Apr. 24, 2003

(51) Int. Cl.[7] .............................................. G01R 31/00
(52) U.S. Cl. ............................ 702/58; 702/58; 702/64; 702/104; 702/185; 324/509; 324/512; 324/519; 324/522; 340/650; 340/652; 340/540; 361/42; 361/47; 361/54
(58) Field of Search ........................ 702/57–60, 64–66, 702/70–72, 104, 117, 182, 183, 185, 189–193, FOR 103–106, 135, 155, 170, 171; 324/509, 512, 519, 522, 523, 525, 527, 531, 754; 340/650, 652, 540, 635, 653; 361/42–50

(56) References Cited

U.S. PATENT DOCUMENTS 5,365,396 A  * 11/1994 Roberts et al. ............... 361/80
5,963,404 A  * 10/1999 Guzman-Casillas et al. .. 361/35
2003/0085715 A1 * 5/2003 Lubkeman et al. ......... 324/509

OTHER PUBLICATIONS

Simpson et al., Low Zero–Sequence Impedances on Generators, Aug. 30, 2000, PSI, Rev. 0, pp. 1–8.*

* cited by examiner

Primary Examiner—Marc S. Hoff
Assistant Examiner—Elias Desta
(74) Attorney, Agent, or Firm—Jensen & Puntigam, P.S.

(57) ABSTRACT

The directional element, following enablement under selected input current conditions, calculates a zero sequence impedance, in response to values of zero sequence voltage and zero sequence current. The current value is selected between two possible values, one being the value from an associated current transformer, the other being the sum of the currents $I_A+I_B+I_C$. The calculated zero sequence impedance is then compared against sensitive selected threshold values, established particularly for ungrounded systems. A forward fault indication is provided when the calculated zero sequence impedance is above a first established sensitive threshold value, and a reverse fault indication is provided when the calculated zero sequence impedance is below a second established sensitive threshold value.

11 Claims, 2 Drawing Sheets

DIRECTIONAL ELEMENT TO DETERMINE FAULTS ON UNGROUNDED POWER SYSTEMS

TECHNICAL FIELD

This invention relates generally to the field of directional elements for use in fault direction determinations for electric power systems, and more specifically concerns such a directional element useful for ungrounded power systems.

BACKGROUND OF THE INVENTION

In an ungrounded power system, there is no intentional ground. Such a power system will typically include a number of distribution lines, each of which services a plurality of feeder loads, which are connected phase-to-phase. When a ground fault (a fault involving one phase of the power signal and ground) occurs on such a system, the only path for the ground fault current is through the distributed line-to-ground capacitance of the surrounding portion (relative to the fault location) of the power system as well as the distributed line-to-ground capacitance of the two remaining unfaulted phases of the faulted circuit.

It is well known that ground faults which occur in ungrounded power systems do not affect the phase-to-phase voltages between the three power signal phases ($V_A$, $V_B$, $V_C$), so that it is possible to continue operating the power system while it is in the faulted condition. In order to continue operating, however, the system must have suitable phase-to-phase insulation and all loads on the system must be connected phase-to-phase.

The fault current for ground faults in ungrounded systems is quite low when compared with grounded systems, and hence, protective relays used for determining ground faults require high sensitivity. Most ground fault detectors (elements) used for ungrounded systems use fundamental frequency voltage and current components in their fault determinations. The conventional wattmetric method is a common directional element solution, but its sensitivity is limited to relatively low fault resistances, i.e. typically no higher than a few kilohms. Other methods use the steady-state harmonic content of current and voltage values, while still other methods detect the fault-generated transient components of both voltage and current to make ground fault determinations. These methods, however, have limited sensitivity because high resistance faults reduce the level of the steady-state harmonics and dampen the transient components of both voltage and current.

Ungrounded power systems do have many of the desirable characteristics of grounded systems, including safety, reduction in communication system interference and decrease in equipment voltage and thermal stress. One of the desirable features of ungrounded systems, as indicated above, is its relatively low ground fault current, so that the system can remain operational during sustained low magnitude faults, without presenting a safety risk to the public.

Ground faults in ungrounded systems often self-extinguish. However, there are some faults which do not self-extinguish; it is desirable to ascertain the existence and location of such faults as well as their direction so as to prevent the possibility of another, later fault combining in some way with the first fault to produce an extremely large fault current.

One difficulty with fault determination in ungrounded systems is the identification of the feeder which is faulted when that feeder is part of a multiple feeder distribution network. In balanced systems (where the feeder lines are approximately the same length) the magnitude of zero sequence current provides a reliable identification of the particular feeder location of the fault. This is because in balanced systems, the capacitance along each feeder line is approximately the same. In unbalanced systems, such a magnitude value is not per se a reliable indication of which feeder contains the fault.

It would hence be desirable to have a reliable directional element for determining the existence of a fault in a multiple feeder distribution network, as well as the direction of that fault, in an ungrounded system, where the fault current is quite small.

SUMMARY OF THE INVENTION

Accordingly, the present invention is a directional element for detecting ground faults on ungrounded systems, comprising: means, when enabled, for calculating a zero sequence impedance for a particular protected line, using zero sequence voltage and zero sequence current on said line; an enabling circuit permitting operation of the calculation means under preselected current conditions; and means comparing the zero sequence impedance values from the calculation means with selected sensitive threshold values appropriate for ungrounded systems, wherein a forward fault indication is provided when the zero sequence impedance is above a first sensitive threshold and a reverse fault indication is provided when the zero sequence impedance is below a second sensitive threshold.

BEST MODE FOR CARRYING OUT THE INVENTION

As indicated above, ground fault detection method/elements typically use zero sequence quantities. This is because zero sequence quantities are available when there are ground faults. The zero sequence impedance of an ungrounded system will typically have a high magnitude. This high magnitude allows the positive and negative sequence impedance values to be ignored without significant loss of accuracy when single line-to-ground faults are being determined.

As indicated above, the faulted feeder must be identified out of the plurality of feeders connected to the distribution line. This is accomplished by including the directional element of the present invention on every feeder (the element is present in the individual relays associated, respectively, with each line). Each directional element monitors the operating condition on its associated feeder for fault conditions, as explained below, and then determines whether the fault is in the forward or reverse direction relative to the directional element. The forward direction refers to a fault away from the directional element toward the distribution feeder, while the reverse direction refers to a fault which is behind the directional element toward the local source or another line.

Figure 1A:
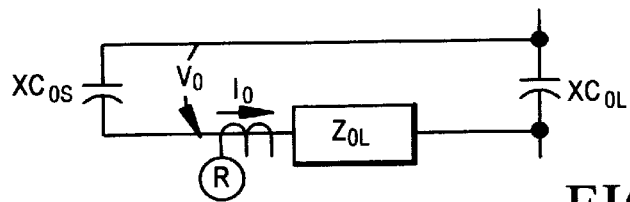
FIGS. 1A and 1B show zero sequence networks for forward and reverse ground faults, respectively.
Figure 1B:
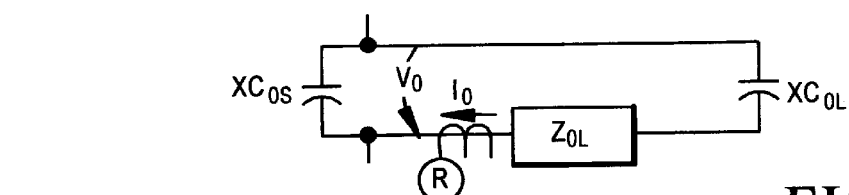

FIG. 1A shows a zero sequence representation for a forward ground fault in an ungrounded system. The protective relay which contains the directional element of the present invention will measure the negative sequence voltage $V_O$ across $XC_{OS}$, where $XC_{OS}$ is the zero sequence impedance of the remainder of the power system behind the relay. The element also measures the zero sequence current $I_O$ through $XC_{OS}$. FIG. 1B shows the zero sequence network which occurs for a reverse ground fault. The measurement of $V_O$ will be across the series combination of $Z_{OL}+XC_{OL}$, where $Z_{OL}$ is the zero sequence line impedance and $XC_{OL}$ is the distributed line ground capacitance of the protected line. The zero sequence current $I_O$ through the combination of $Z_{OL}$ and $XC_{OL}$ is also measured. Hence, in effect, the relay measures $-XC_{OS}$ for forward faults and $Z_{OL}+XC_{OL}$ for reverse faults. The diagrams in FIGS. 1A and 1B show that the zero sequence current $I_O$ is in one direction for forward faults and in the opposing direction for reverse faults.

Figure 2A:
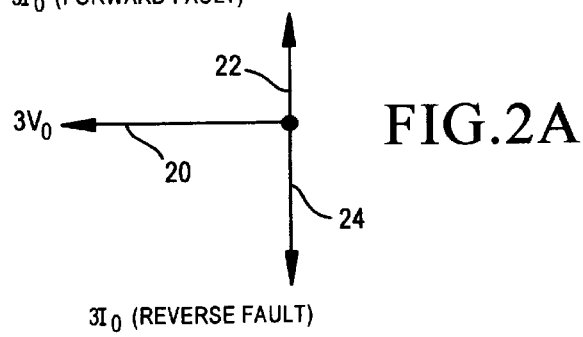
FIGS. 2A and 2B, respectively, show a zero sequence phasor diagram and an impedance plane diagram showing the characteristics of the directional element of the present invention.
Figure 2B:
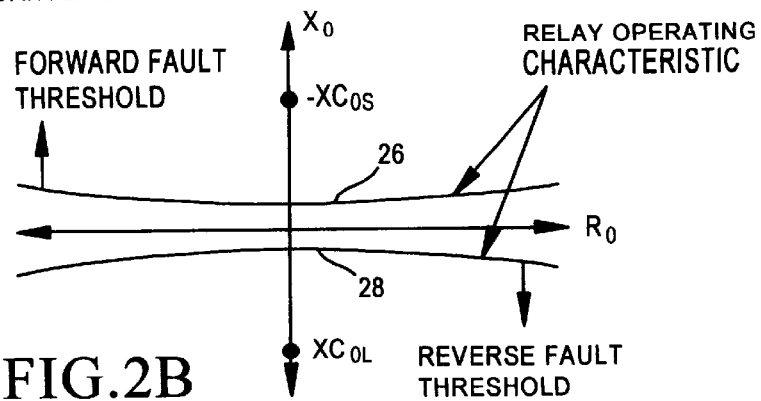

FIG. 2A shows the phasor diagram for forward and reverse faults in the power system, with the zero sequence voltage $3V_O$ being shown at line 20, while the phasors for the zero sequence current $3I_O$ are shown at 22 for forward faults and at 24 for reverse faults. FIG. 2B shows the operating characteristic of the directional element of the present invention for ungrounded systems, in which forward and reverse conditions are determined by differentiating between $-XC_{OS}$ and $XC_{OL}$. The directional element includes two separately settable thresholds which are set for those two impedance values. These two threshold lines are shown at 26 (forward fault threshold) and 28 (reverse fault threshold). If the measured impedance is above the forward threshold 26 and all the supervisory conditions have been met, the fault is declared forward; while if the measured impedance is below the threshold of line 28 and all of the supervisory conditions have been met, the fault is declared reverse.

Figure 3:
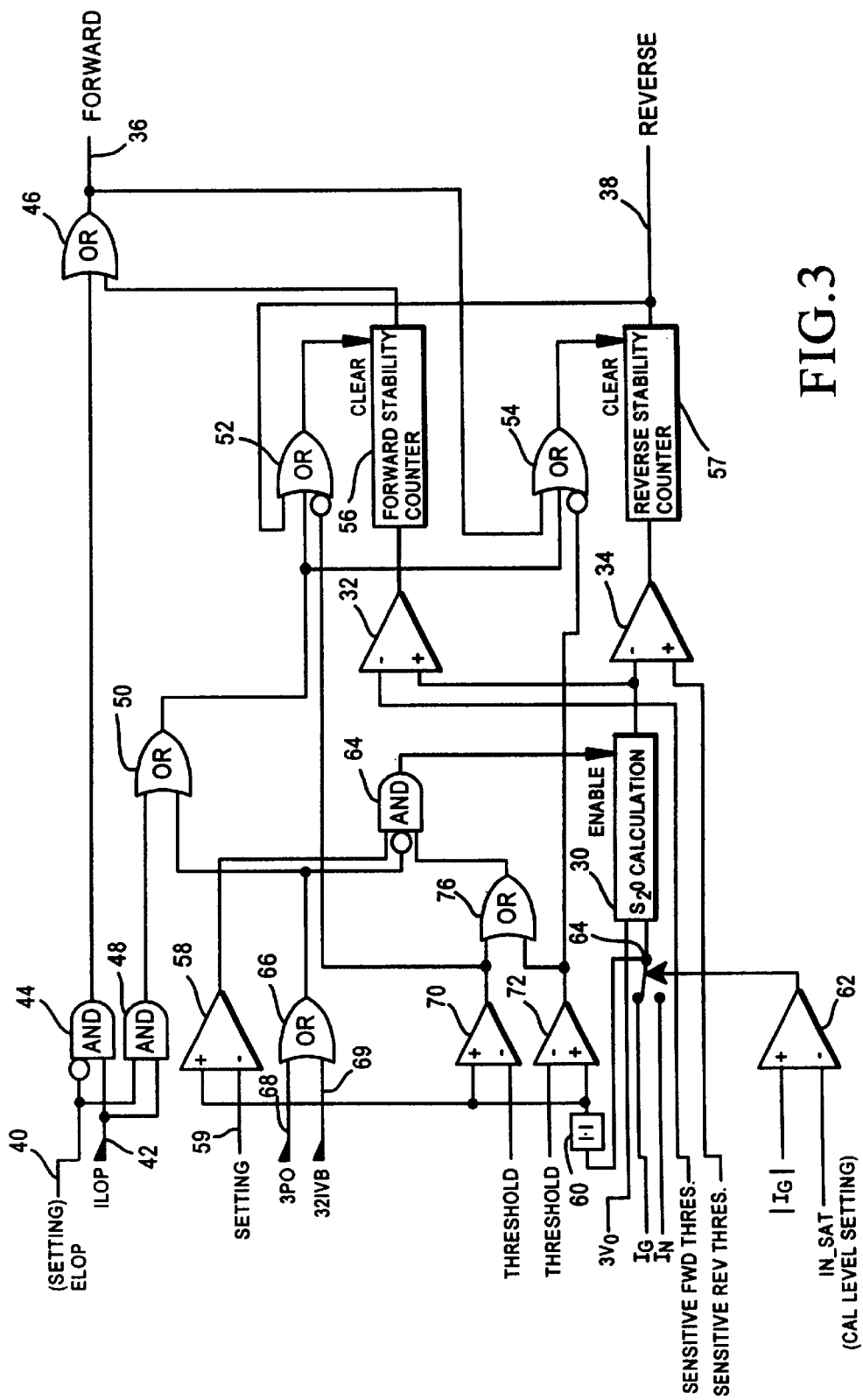
FIG. 3 shows a logic diagram implementing a preferred embodiment of the directional element of the present invention.

FIG. 3 shows the logic diagram for the preferred embodiment of the directional element of the present invention. Basically, the logic element includes a zero sequence impedance calculation circuit 30 and compares the result of that calculation, which occurs every ¼ of the power signal cycle in the embodiment shown, with thresholds in comparators 32 and 34 to make forward or reverse determinations.

The remaining circuitry in FIG. 3 establishes supervisory/operating conditions of the directional element to ensure proper operation and accurate fault determinations. When a forward direction fault is determined, a signal indicating that condition is provided on output line 36, while an indication of a reverse direction fault is provided on output line 38.

With respect to the circuit in more detail, a setting relative to enabling a loss of potential (LOP) determination is on input line 40. This is operator controlled. A setting for ELOP (enable loss of potential) of 0 deasserts the LOP supervision. When ELOP is in a first enable state (Y) and an LOP condition (input line 42) is recognized, the output of AND gate 44 is high, which is applied to an OR gate 46. This results in a forward fault indication on line 36. When ELOP is in a second active state (Y1) and an LOP condition is recognized, then the output of AND 48 is high and both the forward and reverse outputs 36 and 38 are deasserted (there can be no forward or reverse fault indication). This occurs as follows: the high output from AND gate 48 results in a high output from OR gate 50. The output from OR gate 50 is applied as inputs to both OR gates 52 and 54, which, respectively, clear forward stability counter 56 and reverse stability counter 57, which, as explained in more detail below, prevents outputs therefrom to reach OR gate 46 and output line 38.

The next supervisory condition also concerns the enabling of the zero sequence impedance calculator 30. This next condition is determined by comparator 58. One input to comparator 58 on line 59 is a setting established by the operator. This is a positive sequence current restraint factor, with a range of 0.001–0.5 amps, in 0.001 amp steps. Typically, the default value will be 0.001 amps. Compared against this setting is an input magnitude value from an absolute magnitude circuit 60. The input magnitude value refers to the best source of ground current for the circuit, selected between values referred to as $I_G$ and $I_N$.

$I_N$ refers to the current actually obtained (measured) from the current transformer (CT) which is responsive to the power signal current and $I_{N-SAT}$ refers to the saturation threshold associated with the particular current transformer (due to its torroid capability) in the relay. $I_G$ is equal to the sum (calculated) of the three phase currents, $I_A$, $I_B$ and $I_C$, which are measured. When the absolute value of $I_g$ is greater than $I_{N-SAT}$, as determined by comparator 62, a switch 64 will direct the value of $I_G$ to the absolute magnitude circuit 60. Otherwise, the input to magnitude circuit 60 is $I_N$ (from the CT). If the output of magnitude circuit 60 is greater than the positive sequence restraint setting, then the output of comparator 58 is high, which is one input to AND gate 64, the output of which controls the enabling of calculation circuit 30.

OR gate 66 also provides an input to AND gate 64 relative to enabling calculator circuit 30. Inputs to OR gate 66 concern two more supervisory functions, including a three-pole open condition (3PO) on line 68 and a 32 IBV signal on line 69, which is the output of an equation which is high when the user wishes to block the directional element. The presence of either of these two supervisory conditions produces a high output from OR gate 66 which results in a low input to AND gate 64, which prevents a high output from AND gate 64, basically turning the directional element off because the calculator circuit 30 cannot be enabled.

Two threshold current comparisons are made by comparators 70 and 72 to carry out additional supervision. Comparators 70 and 72 establish minimum current levels necessary for operation of the directional element. Comparator 70 determines that the input current value is above a minimum current level for a reliable forward fault direction determination, while comparator 72 determines that the input current level is above the minimum current level for a reliable reverse fault determination direction. The output of absolute magnitude circuit 60 is applied to one input of comparator 70 and one input of comparator 72. The threshold current settings are provided to the other inputs and are preselected by the manufacturer or by the operator for reliable fault determination. The outputs of comparators 70 and 72 are applied to OR gate 76. The output of OR gate 76 is the third input to AND gate 64. When the output of OR gate 76 is high, meaning that the output from either comparator 70 or 72, or both, are high, the output from AND gate 64 will be high, when at the same time the output from comparator 58 is high and the output from OR gate 66 is low. The calculation of circuit 30 is then enabled. The calculation algorithm in calculation circuit 30 is as follows:

$$SZ_0 = \frac{\text{Re}[3V_0 \cdot (I_N \cdot 1\angle 90°)^*]}{I_N^2}$$

where $SZ_O$ is the "sensitive" zero sequence impedance (for ungrounded systems), where $3V_0$ is the zero sequence voltage (measured values of $V_A$, $V_B$ and $V_C$ and $I_N$ is the zero sequence current measured from the current transformers. When $I_G$ is greater than $I_{N\text{-}SAT}$, however, $I_G$ ($I_A$, $I_B$ and $I_C$) is the "$I_n$" value of the algorithm. The output of calculation circuit 30 is then applied at one input to comparators 32 and 34.

The outputs of comparators 70 and 72 are also applied, respectively, to OR gates 52 and 54. When the output of comparator 70 is low, meaning that the forward threshold has not been exceeded, the output from OR gate 52 will be high, which will continuously clear counter 56, preventing a forward fault indication. Likewise, when the output from comparator 72 is low, meaning that the reverse threshold has not been exceeded, the output from OR gate 54 will be high, which continuously clears counter 57, preventing a reverse fault indication. Hence, the forward and reverse thresholds work independently.

As indicated above, the output from calculation circuit 30 is applied to comparators 32, 34. The calculation in the embodiment shown occurs every ¼ cycle of the power signal. This can be changed if desired. The other input to comparator 32 is a "sensitive" forward threshold setting. In the embodiment shown, the setting range is ±300 ohms/$I_{NOM}$, in 0.01 ohm steps. This value will be positive for forward ground faults. In the embodiment shown, the default value is $Z_{0MAG}/2$, where $Z_0$ is the zero sequence replica line impedance. This is a user entered value and typically will be about 8 ohms. Comparator 34 is responsive to a sensitive reverse threshold value. In the embodiment shown, the possible range is the same as for the forward sensitive threshold setting. The default value is $Z_{0MAG}/2 - 0.1$. The "sensitive" thresholds are set to be responsive to the values which are present for faults in ungrounded systems (low current values).

The outputs of comparators 32 and 34 are applied as inputs to counters 56 (forward direction) and 57 (reverse direction). When one counter records two consecutive counts, in response to two consecutive high outputs from either comparator 32 or 34, without the counter being cleared in the meantime, an output is generated from that counter to OR gate 46 and then to output line 36 (forward fault indication) from counter 56, or to output line 38 (reverse fault indication) from counter 57.

An output signal (forward fault) on line 36 is applied to OR gate 54, which will in turn clear reverse counter 57, preventing simultaneous or substantially simultaneous declarations. Conversely, an output of counter 57 will clear the forward direction counter 56 through OR gate 52.

Accordingly, a directional element for power systems has been disclosed which is capable of operating accurately for ungrounded systems. The system also includes a number of supervisory operations which ensure the overall accuracy of operation of the device.

Although a preferred embodiment of the invention has been disclosed here for purposes of illustration, it should be understood that various changes, modifications and substitutions may be incorporated without departing from the spirit of the invention, which is defined by the claims which follow.

What is claimed is:

1. A directional element for detecting ground faults on ungrounded systems, comprising:

means, when enabled, for calculating a zero sequence impedance for a particular protected line, using zero sequence voltage and zero sequence current on said line;

an enabling circuit permitting operation of the calculation means under preselected zero sequence current conditions; and means for comparing the zero sequence impedance values from the calculation means with selected threshold values appropriate for ungrounded systems, wherein a forward fault indication is provided when the zero sequence impedance is above a first sensitive threshold and a reverse fault indication is provided when the zero sequence impedance is below a second sensitive threshold.

2. The system of claim 1, including a selection circuit for selecting between two values of zero sequence current, wherein one current value is the sum of the three phase currents $I_A$, $I_B$ and $1_C$, and wherein the other current value is obtained from a current transformer associated with the directional element, the current transformer being responsive to the power signal.

3. The system of claim 1, including two counters responsive to the comparing means, wherein the counters provide output signals indicating forward and reverse faults, respectively, when a selected number of outputs indicating the threshold values have been exceeded occurs from the comparing means prior to clearing of the counters which occurs under preselected supervisory conditions.

4. The system of claim 1, wherein the selected number of outputs is two.

5. The system of claim 3, wherein one supervisory condition includes a loss of potential condition.

6. The system of claim 3, wherein one supervisory condition includes satisfying minimum output current thresholds for the forward and/or reverse fault determination.

7. The system of claim 3, wherein one supervisory condition includes a three-pole open condition.

8. The system of claim 3, wherein one supervisory condition is a maximum input current.

9. The system of claim 3, wherein one supervisory condition includes satisfaction of a preestablished range for unbalanced current.

10. The system of claim 1, including means for preventing a reverse fault indication following determination of a forward fault, and means for preventing a forward fault indication following determination of a reverse fault.

11. The system of claim 1, wherein the current value is equal to the value of current from the current transformer, unless the sum of $I_A + I_B + I_C$ is greater than the saturation value of the current from the current transformer, in which case the current value is $I_A + I_B + I_C$.

* * * * *